(12) United States Patent
Weidman et al.

(10) Patent No.: US 8,821,986 B2
(45) Date of Patent: Sep. 2, 2014

(54) ACTIVATED SILICON PRECURSORS FOR LOW TEMPERATURE DEPOSITION

(75) Inventors: Timothy W. Weidman, Sunnyvale, CA (US); Todd Schroeder, Toledo, OH (US); David Thompson, San Jose, CA (US); Jeffrey W. Anthis, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 179 days.

(21) Appl. No.: 13/609,551

(22) Filed: Sep. 11, 2012

(65) Prior Publication Data

US 2013/0071580 A1 Mar. 21, 2013

Related U.S. Application Data

(60) Provisional application No. 61/534,128, filed on Sep. 13, 2011.

(51) Int. Cl.
| | |
|---|---|
| *C23C 16/50* | (2006.01) |
| *C23C 16/34* | (2006.01) |
| *C23C 16/505* | (2006.01) |
| *C23C 16/36* | (2006.01) |

(52) U.S. Cl.
CPC .............. *C23C 16/50* (2013.01); *C23C 16/505* (2013.01); *C23C 16/36* (2013.01)
USPC ...... 427/535; 427/576; 427/577; 427/249.15; 427/255.393

(58) Field of Classification Search
CPC ........ C23C 16/50; C23C 16/34; C23C 16/325
USPC .............. 427/535, 576, 577, 249.15, 255.393
See application file for complete search history.

(56) References Cited

U.S. PATENT DOCUMENTS

| 6,730,802 B2 | 5/2004 | Shen et al. |
| 7,837,790 B2 | 11/2010 | Kim et al. |
| 2005/0241567 A1* | 11/2005 | Scarlete et al. ................... 117/7 |
| 2006/0110943 A1 | 5/2006 | Swerts et al. |
| 2008/0220155 A1* | 9/2008 | Yoshizumi et al. ........... 427/117 |
| 2009/0155606 A1 | 6/2009 | Yoon et al. |
| 2009/0179306 A1* | 7/2009 | Grill et al. ...................... 257/632 |
| 2010/0003406 A1 | 1/2010 | Lam et al. |
| 2010/0129994 A1 | 5/2010 | Awad et al. |
| 2011/0101489 A1* | 5/2011 | Edelstein et al. .............. 257/506 |
| 2011/0215445 A1* | 9/2011 | Yang et al. ..................... 257/632 |
| 2012/0122302 A1* | 5/2012 | Weidman et al. .............. 438/478 |
| 2012/0161295 A1* | 6/2012 | Michalak et al. .............. 257/632 |
| 2012/0196452 A1 | 8/2012 | Balseanu et al. |
| 2012/0214318 A1* | 8/2012 | Fukazawa et al. ............. 438/786 |
| 2012/0251797 A1* | 10/2012 | Smith et al. ................. 428/195.1 |
| 2014/0038427 A1* | 2/2014 | Weidman et al. ............. 438/778 |

FOREIGN PATENT DOCUMENTS

| JP | 2003/179054 | | 6/2003 |
| JP | 2008/218684 | | 9/2008 |
| JP | 2012-87020 | * | 5/2012 |
| KR | 2007/0051279 | | 5/2007 |
| KR | 10-1032817 | | 5/2011 |
| WO | WO-95/10638 | | 4/1995 |

OTHER PUBLICATIONS

Li, Bin, et al "Preparation of Silicon Carbide Coatings from Liquid Carbosilanes by Chemical Vapor Deposition". Journal of Materials Engineering and Performance, vol. 16(6) Dec. 2007, 775-778.*
Lee, Wei, et al., "Chemical Vapor Deposition of Silicon Carbide Using a Novel Organometallic Precursor". Mat. Res. Soc. Symp. Proc. vol. 131, 1989, pp. 431-437.*
Interrante, L.V., et al., "Silicon-based ceramics from polymer precursors". Pure Appl. Chem., vol. 74, No. 11, pp. 2111-2117, 2002.*
"International Seach Report and Written Opinion of CPT/US2012/054581", mailed on Feb. 28, 2013, 12 pages.

* cited by examiner

*Primary Examiner* — Bret Chen
(74) *Attorney, Agent, or Firm* — Servilla Whitney LLC

(57) ABSTRACT

Provided are processes for the low temperature deposition of silicon-containing films using activated SiH-containing precursors. The SiH-containing precursors may have reactive functionality such as halogen or cyano moieties. Described are processes in which halogenated or cyanated silanes are used to deposit SiN films. Plasma processing conditions can be used to adjust the carbon, hydrogen and/or nitrogen content of the films.

20 Claims, 6 Drawing Sheets

ACTIVATED SILICON PRECURSORS FOR LOW TEMPERATURE DEPOSITION

CROSS-REFERENCE TO RELATED APPLICATIONS

This application claims priority to U.S. Provisional Application No. 61/534,128, filed Sep. 13, 2011, the contents of which are hereby incorporated by reference in their entirety.

TECHNICAL FIELD

Embodiments of the present invention generally relate to the field of film deposition, and specifically to precursors for low temperature plasma enhanced chemical vapor deposition and atomic layer deposition.

BACKGROUND

In the manufacture of electronic devices such as integrated circuits, a target substrate, such as a semiconductor wafer, is subjected to various processes, such as film formation, etching, oxidation, diffusion, reformation, annealing, and natural oxide film removal. Silicon-containing films are an important part of many of these processes.

Silicon-containing films are used for a wide variety of applications in the semiconductor industry. Examples of silicon-containing films include epitaxial silicon, polycrystalline silicon (poly-Si), and amorphous silicon, epitaxial silicon germanium (SiGe), silicon germanium carbide (SiGeC), silicon carbide (SiC), silicon nitride (SiN), silicon carbonitride (SiCN), and silicon carboxide (SiCO). As circuit geometries shrink to smaller feature sizes, lower deposition temperatures for Si-containing films are preferred, for example, to reduce thermal budgets.

Silicon nitride films have very good oxidation resistance and insulating qualities. Accordingly, these films have been used in many applications, including oxide/nitride/oxide stacks, etch stops, oxygen diffusion barriers, and gate insulation layers, among others. Several methods are known for forming a silicon nitride film on the surface of a semiconductor wafer by Chemical Vapor Deposition (CVD). In thermal CVD, a silane gas, such as monosilane ($SiH_4$) or polysilane, is used as a silicon source gas.

SiN film formation has also been carried out via atomic layer deposition using halosilane and ammonia. However, this process requires high temperatures, in excess of 500° C., to effect clean conversion and eliminate $NH_4X$ byproducts. In device manufacturing, processes that can be performed at lower temperatures are generally desired for thermal budget and other reasons.

SUMMARY

A first aspect of the present invention is directed to a method of forming a layer on a substrate surface, the method comprising providing a substrate surface reactive to halides or cyano moieties, exposing the substrate surface reactive to halides or cyano moieties to a halogenated or cyanated carbosilane precursor including carbon, silicon and hydrogen to form a layer containing carbon, silicon and hydrogen, at least partially dehydrogenating the layer containing carbon, silicon and hydrogen, and nitriding the layer containing carbon, silicon and hydrogen. In one embodiment of this aspect, nitriding the layer comprises exposing the layer containing carbon, silicon and hydrogen to a nitrogen-containing plasma. In another embodiment, the substrate surface is at a temperature less than about 200° C. during formation of the layer. In yet another embodiment, the substrate is a semiconductor substrate. In another embodiment of this aspect, the carbosilane precursor is monohalogenated.

According to certain embodiments of the invention, the carbosilane precursor may be linear, branched or cyclic. In a specific embodiment, the carbosilane precursor contains a bridging methylene group, wherein the carbon in the methylene group is bonded to two silicon atoms. In an even more specific embodiment, the carbosilane precursor is selected from the group consisting of 1,3,5-trisilapentane, 1,3-disilabutane, 1,3-disilacyclobutane and 1,3,5-trisilacyclohexane. In a particular embodiment, the precursor is 1,3-disilabutane. The 1,3-disilabutane may be monohalogenated or monopseudohalogenated. In an alternative embodiment, the carbosilane precursor is 1,3,5-trisilapentane. The 1,3,5-trisilapentane may be monohalogenated or monopseudohalogenated.

In one or more embodiments, the carbosilane precursor does not contain a silicon atom bridging two methylene groups. In some embodiments, the carbosilane precursor has a structure represented by:

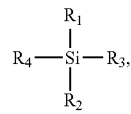

wherein $R_1$ is selected from one or more of a halogen or pseudohalogen, $R_2$ is a methyl group, and $R_3$ and $R_4$ are each independently a halogen or pseudohalogen, methyl or hydrogen.

In another embodiment of this aspect, dehydrogenating the layer containing carbon, silicon and hydrogen comprises exposing the layer containing carbon, silicon and hydrogen to a plasma containing at least one of hydrogen, helium and argon. In yet another embodiment, nitridation of the layer containing carbon, silicon and hydrogen comprises exposing the layer containing carbon, silicon and hydrogen to a plasma containing nitrogen. In one embodiment, dehydrogenation and nitridation occur substantially simultaneously. In an alternative embodiment, dehydrogenation and nitridation occur sequentially.

In accordance with certain embodiments, the halogen is selected from the group consisting of Br, I and Cl. In a particular embodiment, the halogen is Br. In another embodiment, the carbosilane precursor is symmetrical prior to halogenation or cyanation.

A second aspect of the invention relates to a method of forming a layer on a substrate surface, the method comprising providing a substrate surface reactive to halides or cyano moieties, exposing the substrate surface reactive to halides or cyano moieties to a halogenated or cyanated silane precursor including silicon and hydrogen to form a layer containing silicon and hydrogen, at least partially dehydrogenating the layer containing silicon and hydrogen, and nitriding the layer including silicon and hydrogen, wherein nitriding the layer comprises exposing the layer containing silicon and hydrogen to a nitrogen-containing plasma.

In one embodiment, the substrate surface is at a temperature less than about 200° C. during forming the layer. In another embodiment, the silane precursor is monohalogenated. In yet another embodiment, the silane precursor comprises at least one of disilane, trisilane, neopentasilane, and trisilylamine. In a more specific embodiment, the silane precursor comprises trisilylamine. In an even more specific embodiment, the trisilylamine is monobromated.

In another embodiment of this aspect, the halogenated or cyanated silane precursor further comprises carbon. In one variant of this embodiment, the carbosilane precursor contains a bridging methylene group, wherein the carbon in the methylene group is bonded to two silicon atoms. Variants of this embodiment relate to where the silane precursor comprising carbon is selected from the group consisting of 1,3,5-trisilapentane, 1,3-disilabutane, 1,4-disilabutane and 1,3,5-trisilacyclohexane. In a specific variant, the silane precursor comprising carbon is 1,3-disilabutane. The 1,3-disilabutane is monohalogenated or monopseudohalogenated. In an alternative variant, the silane precursor comprising carbon is 1,3,5-trisilapentane. The 1,3,5-trisilapentane may be monohalogenated or monopseudohalogenated. In another embodiment, the silane precursor is symmetrical prior to halogenation or cyanation.

Another embodiment of this aspect relates to where treating the substrate surface to reduce the amount of hydrogen on the substrate surface comprises exposing the substrate surface to a dehydrogenating plasma. In one embodiment, the dehydrogenating plasma is selected from the group consisting of Ar, He and $H_2$ plasma, or combinations thereof. In one embodiment, dehydrogenating and nitriding occur substantially simultaneously. In an alternative embodiment, dehydrogenating and nitriding occur sequentially.

A third aspect of the invention relates to a method of forming a layer on a substrate, the method comprising providing a substrate having silicon and hydrogen on the substrate surface, exposing the substrate surface to a nitrogen-containing plasma to enhance reactivity of the substrate surface to silicon-halide bonds or silicon-cyano bonds, reacting the surface of the substrate with a halogenated or cyanated precursor, and exposing the substrate surface to dehydrogenating plasma to reduce the amount of hydrogen on the substrate surface. In one embodiment, the silicon halide or silicon cyano species further comprises carbon.

DETAILED DESCRIPTION

Figure 1A:
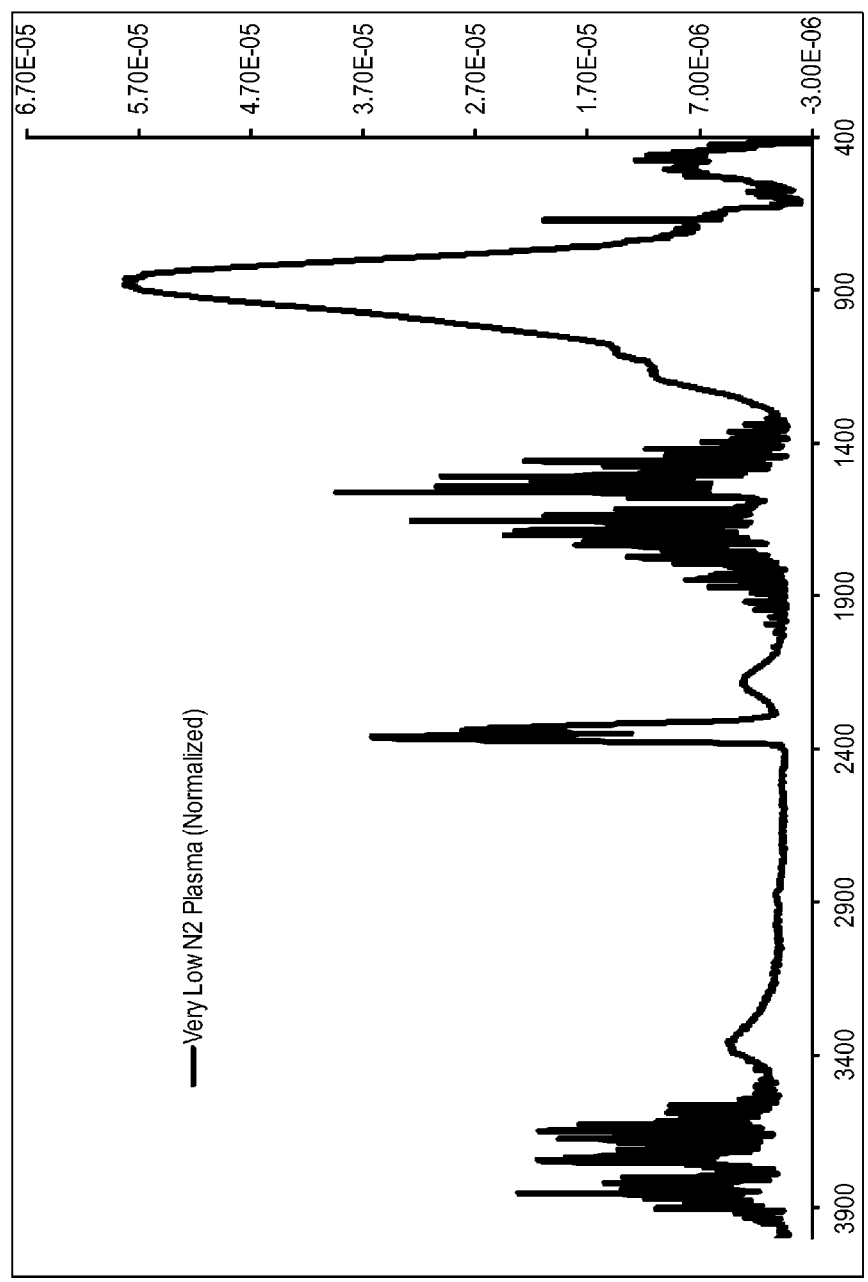
FIGS. 1A-C are Fourier transform infrared spectra of three SiCN films formed in accordance with an embodiment of the invention.

Before describing several exemplary embodiments of the invention, it is to be understood that the invention is not limited to the details of construction or process steps set forth in the following description. The invention is capable of other embodiments and of being practiced or being carried out in various ways.

A "substrate surface" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, glass sheets, ceramic substrates and semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing steps disclosed may also be performed on an underlayer formed on the substrate as disclosed in more detail below, and the term "substrate surface" is intended to include such underlayer as the context indicates.

As used herein, an "SiH-containing precursor" refers to a precursor molecule that contains a plurality of Si—H bonds. SiH-containing precursors include silanes and carbosilanes. The term "silanes" refers to compounds which contain silicon and hydrogen atoms, including silicon-to-hydrogen bonds. The term "carbosilanes," which may be used interchangeably with "organosilanes," refers to compounds that contain silicon, hydrogen and carbon atoms, and contain at least one carbon-to-silicon covalent bond. Thus, a "halogenated SiH-containing precursor" or "halogenated silane" or "halogenated carbosilane" refers to a precursor molecule where at least one of the hydrogen atoms bonded to a silicon atom is replaced with a halogen. By extension, a "cyanated SiH-containing precursor" or "cyanated silane" or "cyanated carbosilane" refers to a precursor molecule where at least one of the hydrogen atoms bonded to a silicon atom is replaced with a cyano (CN) group.

As used herein, "containing at least one carbon atom bridging at least two silicon atoms" refers to a carbosilane that contains an Si—C—Si component. The carbon may have two hydrogens, which would constitute a methylene group and result in a Si—$CH_2$—Si component. The silicon atoms may have a wide variety of substituents, including, but not limited to, hydrogen or additional silicon and/or carbon atoms. In some cases, the carbon atom may bridge three or four silicon atoms.

As used herein, "low temperature" refers to processes that are conducted at less than 400° C. In specific embodiments, low temperature refers to less than 300° C., and in more specific embodiments, less than 200° C. and in highly specific embodiments, less than 100° C.

As used herein, "low-powered energy source" refers to a source of energy that will not damage carbosilane precursor deposited at a substrate surface. For example, where the source of energy is a plasma, the RF value is less than about 200 W.

An aspect of the invention pertains to methods of forming a layer on a substrate, which involves providing a substrate having silicon and hydrogen on the substrate surface. A substrate surface can be modified and/or treated in any conventional way to provide a surface having silicon and hydrogen on the substrate surface, such as by treatment with a plasma. The surface having silicon and hydrogen on the surface can then be exposed to a nitrogen-containing plasma to enhance reactivity of the substrate surface to silicon-halide bonds or silicon-cyano bonds. Then, the substrate surface having enhanced reactivity to silicon-halide bonds or silicon-cyano bonds is reacted with a halogenated or cyanated precursor. After the reaction, the substrate surface is exposed to a dehydrogenating plasma to reduce the amount of hydrogen on the substrate surface.

In another aspect of the invention, a substrate is provided that has a substrate surface reactive to halides or cyano moieties. Such a surface can be provided by plasma treatment as described further herein. After providing the substrate having the surface reactive to halides or cyano moieties, the substrate surface can exposed to a halogenated or cyanated silane precursor including silicon and hydrogen to form a layer containing silicon and hydrogen. The layer containing silicon and hydrogen is then at least partially dehyrogenated, for example, by using a plasma treatment as described further below at least partially dehydrogenating the layer containing silicon and hydrogen. Also, the layer can be further treated, either sequentially or simultaneously to add nitrogen to the layer including silicon and hydrogen. For example, nitriding the layer can involve exposing the layer containing silicon and hydrogen to a nitrogen-containing plasma.

A more specific aspect of the invention pertains to the formation of SiCN films on a substrate. In one embodiment, a substrate surface reactive to halides or cyano moieties is provided, which is exposed to a halogenated or cyanated carbosilane precursor including carbon, silicon and hydrogen to form a layer containing carbon, silicon and hydrogen. The layer containing carbon, silicon and hydrogen is then at least partially dehydrogenated and nitridated, for example, by exposing the film to plasma, preferably a low power plasma.

According to embodiments of the invention, SiC, SiN and SiCN films can be formed and activated at low temperatures using halogenated or cyanated SiH-containing precursors. In some embodiments, film formation can occur via chemical vapor deposition (CVD), plasma-enhanced chemical vapor deposition (PECVD), atomic layer deposition (ALD) or plasma-enhanced atomic layer deposition (PEALD). In addition to thermal budget considerations, it is desirable to process at lower temperature and at lower power for plasma activation to prevent damage to the underlying substrate surface. According to one or more embodiments, processes are provided that involve dehydrogenative densification and nitridation of SiH-containing films or layers formed on substrates. This allows for the formation of N—H functionality useful for promoting self-limiting reactions of the precursors described herein. Such processes may reduce or eliminate the use of ammonia as a co-reactant. A benefit of eliminating the use of ammonia is that the formation of ammonium halide byproducts is avoided. Ammonium halides are reactive, which may cause uncontrolled growth within deposition chambers, particularly cold-wall chambers. However, it will be understood that according to one or more embodiments, ammonia may be used, particularly in hot wall chambers.

ALD employs sequential, self-limiting surface reactions to form layers of precise thickness controlled at the Angstrom or monolayer level. Most ALD processes are based on binary reaction sequences which deposit a binary compound film. Each of the two surface reactions occurs sequentially, and because they are self-limiting, a thin film can be deposited with atomic level control. Because the surface reactions are sequential, the two gas phase reactants are not in contact, and possible gas phase reactions that may form and deposit particles are limited. The self-limiting nature of the surface reactions also allows the reaction to be driven to completion during every reaction cycle, resulting in films that are continuous and pinhole-free.

For Si—H precursors to be useful in a low temperature deposition process such as an ALD or PEALD sequence, an effective process flow provides surface functionality designed to promote efficient reaction with the selected precursor. In one or more embodiments, process sequences are used to convert SiC films to SiCN films exhibiting residual N—H content. The residual N—H content provides reactive "handles" for the next layer of deposition. According to one or more embodiments, N—H bonds are made to be reactive with precursors having Si—X bonds, where X is a halogen such as chlorine, bromine or iodine or a pseudohalogen such as a nitrile (cyano) substituent. These N—H groups react with a halogenated or cyanated precursor. In specific embodiments, such process sequences include exposure to dehydrogenating and/or nitriding plasmas. Because N—H bonds are reactive with Si—X bonds, more reactive functionality is added to carbosilane or silane precursors to promote their reactivity with surface N—H bonds.

Accordingly, in one embodiment, a process of forming a silicon-containing film is provided, which uses a halogenated or cyanated precursor. The halogen can be chlorine, bromine or iodine. In a specific embodiment, the halogen used is bromine. In one particular embodiment, the carbosilane or silane precursor is monohalogenated.

In specific embodiments, carbosilanes to produce thin films of SiC. In some embodiments, these thin films of SiC can then be converted to SiCN by displacing some of the carbon atoms from the SiC. Carbosilane precursors, even without halogenation/pseudohalogenation, have been demonstrated to undergo efficient dehydrogenation to silicon-rich SiC. Thus, according to various embodiments, carbosilane precursor at the substrate surface is at least partially densified/ dehydrogenated. In one embodiment, dehydrogenation is plasma-induced. A helium, argon or hydrogen-containing plasma may be used for dehydrogenation. In specific embodiments, dehydrogenation involves the use of a hydrogen plasma.

In addition to dehydrogenation, nitrogen can be introduced into the SiC layer by nitridation to form SiCN. In a specific embodiment, nitridation occurs via exposure to a nitriding plasma, such as a nitrogen-containing plasma. These deposition processes can be accomplished using relatively low RF power conditions and at temperatures lower than previously available. In previous methods, higher temperatures of more than 500° C. were necessary. In specific embodiments, substrate temperature during deposition can be lower than about 200° C. In some embodiments, substrate temperature may be below 100° C.

Other embodiments generally relate to the use of other halogenated or cyanated SiH-containing precursors, including silanes, to form SiN layers, using an analogous process as described above. According to one or more embodiments, the activation of SiH-containing precursors to be reactive with N—H groups on a substrate surface involves reacting the precursors such that the hydrogen in at least one Si—H bond is replaced with a halogen or pseudohalogen. Suitable halogens include bromine, chlorine and iodine. In a specific embodiment, bromine is the halogen used. Bromine offers some advantages over the other halogens. This includes higher reactivity than chlorine at lower temperatures, and bromine is more easily removed from the precursor molecule than Cl, which is necessary to bind the precursor to the substrate surface. In an alternative embodiment, the halogen is iodine. Iodine may be easier to displace than both bromine and chlorine. However, where the halogen is iodine, there may be potential difficulties in removing byproduct hydrogen iodide gas.

Precursors may be based on carbosilanes for SiC/SiCN films, or based on silanes for SiN films, depending on the desired film. Carbosilanes, sometimes also referred to as organosilanes, are compounds containing carbon-to-silicon covalent bonds. A wide variety of carbosilanes are suitable for producing SiC and SiCN films. However, according to certain embodiments, the carbosilane precursors should be chosen such that there is reduced fragmenting in deposited films. Fragmentation of the film to volatile fragments prevents densification, and causes shrinking and cracking in flowable applications. Carbosilanes may be linear, branched or cyclic. A particularly suitable type of carbosilane is one that contains a bridging methylene groups between two silicon atoms, such that the carbon in the methylene group is bonded to the two silicon atoms. Either one, both, or neither of the two silicon atoms may be halogenated or pseudohalogenated. Higher carbosilanes with an extended Si—C—Si backbone are particularly suitable as they tend towards dehydrogenative densification reactions, instead of fragmentation. In another embodiment, the carbosilane contains a bridging CH group or simple C atom between three or four silicon atoms respectively. Alternatively, the carbosilane precursor may not have a bridging carbon carbon directly bonded to two silicon atoms. Precursors without such bridging methylene groups, such as those initially containing only terminal methyl substituents may undergo rearrangements on plasma excitation to form methylene bridged carbosilanes and are thus also suitable, though in this case there is also substantial cleavage of the Si—C bond of the Si—CH$_3$ substituent.

Polycarbosilanes containing more extended backbones of alternating Si—C—Si—C—Si bonds, such as 1,3,5-trisilapentane are particularly suitable. Examples of suitable carbosilane precursors include, but are not limited to 1,3,5-trisilapentane, 1,3,5-trisilaacyclohexane, 1,4-disilabutane, 1,3-disilabutane, 1,3-disilapropane and 1,3-disilacyclobutane. In a particular embodiment, the carbosilane precursor is 1,3-disilabutane. In another particular embodiment, the carbosilane precursor is 1,3,5-trisilapentane. Where a desired level of carbon is desired and the precursor contains only terminal methyl substituents, it is generally necessary to begin with precursors possessing at least twice the Si:C ratio desired in the final film.

Silanes are the silicon analogs of alkane hydrocarbons and may be used to deposit SiN films. Silane precursors may be linear, branched or cyclic. These precursors may also have a wide variety of hydrogenation. Suitable silanes include any volatile silicon-containing precursor containing at least one Si—H bond which can be substituted with a halogen or psuedohalogen group. Examples of suitable silane precursors include, but are not limited to, trisilylamine (TSA), disilane, trisilane and neopentasilane.

Suitable pseudohalogens are those which form a bond with Si that has similar reactivity with N—H bonds as halogenssilicon bonds. An example of a suitable pseudohalogen is a cyano (CN) substituent. In other embodiments, two or three Si—H bonds may be halogenated, cyanated, or replaced with another suitable pseudohalogen.

Pseudohalogens, such as a cyano substituent, may be used instead of halogens. The use of pseudohalogens has potential advantages over the use of halogen-containing precursors. One such advantage exists where ammonia is used as a co-reactant. When ammonia is used in this way, solid NH$_4$X (where X represents a halogen) byproducts are formed and accumulated. Where a cyano group is instead used, the analogous ammonium cyanide (NH$_4$CN) is formed. NH$_4$CN is a volatile solid which sublimes/dissociates at around 40° C., and thus does not interfere with the atomic layer deposition process. Another advantage in using a cyanosilane type precursor lies in the avoidance of strong halogen acid byproducts, like HCl, HBr or HI. These halogen acids can be corrosive to process equipment or materials present in the wafer that is being processed. However, the use of a cyano group can produce toxic gas. Thus, if a cyano group is used, measures should be taken to ensure complete destruction of the HCN gas produced, as well as any accidental contact of the silicon nitrile-based precursor with moisture or protic solvents or acids. HCN detectors should be placed along all precursor delivery paths, and direct or remote plasma chamber cleaning protocols should be adopted to ensure destruction of all cyanide-containing compounds or materials before the process chambers are opened to ambient air for inspection or service.

For example, the carbosilane 1,3,5-trisilapentane may be reacted with a suitable halogenation reagent to replace one of the eight reactive Si—H bonds with a halogen atom. Thus, if bromine is used, then 1-bromo-1,3,5-trisilapentane would be formed. Of course, it is possible that the reaction would substitute more than one bromine atom on a given precursor. Accordingly, purification may be necessary due to the different volatilities of the resulting products. Halogenation may be carried out using various methods. In one embodiment, the Si—H containing precursor may be reacted directly with the halogen. Accordingly, where bromination is desired, the Si—H containing precursor may be reacted with Br$_2$ to replace one of the hydrogens and obtain a Si—Br bond. This reaction would produce HBr as the corresponding byproduct. In an alternative embodiment, bromination may be achieved by reacting the Si—H containing precursor with CuBr$_2$ to obtain a Si—Br bond which results in a CuBr/Cu byproduct.

In one or more embodiments, the carbosilane precursors may be based on halogenated or cyanated silanes with at least one methyl substituent. Such precursors contain a central silicon atom, with four substituents including at least one halogen or cyano group and at least one methyl group. In one or more embodiments, the halogens may be selected from F, Cl, Br and I. Thus, for example, the precursor may comprise dimethylchlorosilane. In alternative embodiments, the precursors are cyanated instead of halogenated. Accordingly, in one or more embodiments, the precursor has a structure represented by:

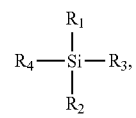

wherein R$_1$ is selected from one or more of a halogen or pseudohalogen, R$_2$ is a methyl group, and R$_3$ and R$_4$ are each independently a halogen or pseudohalogen, methyl or hydrogen. In further embodiments, the halogen or pseudohalogen is selected from one or more of F, Cl, Br, I and a cyano group.

Although such precursors do not feature bridging methylene groups between at least two silicon atoms, it is thought that dehydrogenation allows for cross linking of the methyl groups, producing a film similar to that deposited using precursors with bridging methylene groups. Accordingly, these smaller precursors may serve as relatively inexpensive alternatives to precursors with bridging methylene groups. However, in some embodiments, use of the precursors based on halogenated or cyanated silanes with at least one methyl substituent may result in more carbon loss than when deposited using precursors with at least one bridging methylene group.

These halosilanes, halocarbosilanes, pseudohalosilanes, pseudohalocarbosilanes and related derivatives, react with surface N—H functionality. The carbosilane or silane attaches to the nitrogen atom on the surface, and the halogen or pseudohalogen is eliminated with the hydrogen atom. Thus, for example, where the halogen used is bromine, HBr is the byproduct of the reaction. This reaction is what provides a mechanism for a self-limiting reaction that provides a monolayer surface with the carbosilane or silane precursors, which can be treated with the plasma sequences described herein. For example, a dehydrogenation plasma may be used which results in the formation of an SiC layer.

The ratio of silicon to carbon may be adjusted, depending on the plasma power, exposure time and temperature. For example, the ratio of C:Si can readily be reduced in a SiCN composition by replacing carbon with nitrogen atoms using post-treatment plasmas. The ratio of C to Si may be increased by utilizing precursors containing a higher initial C to Si ratio. Generally, carbosilane precursors containing carbon in a bridging position between two silicon atoms can be consolidated to carbide-type ceramics with efficient retention of carbon. On the other hand, carbon is not retained to such extent where the precursor does not contain a bridging carbon atom. For example, precursors based on methylsilanes undergo consolidation with substantial loss of carbon.

Another aspect of the invention relates to exposure of the substrate surface to plasma as part of the process of forming the film or layer. The surface with bound SiH-containing precursor is exposed to a dehydrogenation plasma. Suitable dehydrogenation plasmas include, but are not limited to, $H_2$, He and Ar. The surface is then exposed to a nitriding plasma. Suitable nitriding plasmas include, but are not limited to $N_2$ and ammonia. Exposure to the plasmas may be done substantially simultaneously or sequentially. As used herein, "substantially simultaneously" refers to either a co-flow or where there is merely overlap between exposures of the two components.

When done sequentially, the dehydrogenating plasma may first be applied, followed by the nitriding plasma. Any number of sequences may be used. In one embodiment, plasma exposure may occur in every step of the process. In another embodiment, plasma exposure may occur every other. Where a carbosilane-based precursor is used, exposure to a dehydrogenation plasma results in the deposition of SiC. Subsequent exposure to a nitriding plasma results in conversion of the SiC film to SiCN. Dehydrogenation and nitridation creates N—H functionality on the deposited film which are available for the next deposition cycle.

Accordingly, one aspect of the invention relates to a method of forming a layer on a substrate surface, the method comprising providing a substrate surface reactive to halides or cyano moieties, exposing the substrate surface reactive to halides or cyano moieties to a halogenated or cyanated carbosilane precursor including carbon, silicon and hydrogen to form a layer containing carbon, silicon and hydrogen, at least partially dehydrogenating the layer containing carbon, silicon and hydrogen, and nitriding the layer containing carbon, silicon and hydrogen. In one embodiment of this aspect, nitridation occurs via exposing the layer containing carbon, silicon and hydrogen to a nitrogen-containing plasma. In another embodiment, the substrate surface is at a temperature of less than about 200° C. during forming the layer. In a further embodiment, the temperature is less than about 100° C.

In a related embodiment, dehydrogenating the layer containing carbon, silicon and hydrogen comprises exposing the layer containing carbon, silicon and hydrogen to a plasma containing at least one of hydrogen, helium and argon. In another embodiment, nitridation of the layer containing carbon, silicon and hydrogen comprises exposing the layer containing carbon, silicon and hydrogen to a plasma containing nitrogen.

In one embodiment of this aspect, the carbosilane that is used is linear, branched or cyclic. In a more specific embodiment, the carbosilane is selected from the group consisting of 1,3,5-trisilapentane and 1,3,5-trisilacyclohexane, bis(tertiarybutylamino)silane. In a yet more specific embodiment, the carbosilane is 1,3,5-trisilapentane. In another embodiment, these carbosilane is halogenated, wherein the halogen is selected from the group consisting of Br, I and Cl. In a specific embodiment, the halogen is Br.

In one embodiment of this aspect, dehydrogenation and nitridation occur substantially simultaneously. By contrast, in another embodiment, dehydrogenation and nitridation occur sequentially.

An analogous process may be used for other SiH-containing silanes to make them reactive with surface N—H groups during atomic layer deposition sequences. Activation of the SiH-containing silanes also entails replacing one of the hydrogens bonded to a silicon atom with a halogen or pseudohalogen. In one embodiment, bromine, chlorine and iodine are suitable halogens. In a specific embodiment, the precursor used is a silane halogenated with bromine. Cyano groups are also a suitable pseudohalogen. SiN films may be obtained by activating and using these precursors.

For example, in one embodiment, trisilylamine (TSA) may be halogenated by replacement of any of the nine identical hydrogen atoms with a halogen or pseudohalogen. Trisylylamine could therefore be brominated using $Br_2$ to form mono-bromo-trisilylamine. Such precursors can then be used in low temperature atomic layer deposition of SiN films.

Accordingly, another aspect of the invention relates to a method of forming a layer on a substrate surface, the method comprising providing a substrate surface reactive to halides or cyano moieties; exposing the substrate surface reactive to halides or cyano moieties to a halogenated or cyanated silane precursor including silicon and hydrogen to form a layer containing silicon and hydrogen; at least partially dehydrogenating the layer containing silicon and hydrogen; and nitriding the layer including silicon and hydrogen, wherein nitriding the layer comprises exposing the layer containing silicon and hydrogen to a nitrogen-containing plasma. In one embodiment, the substrate surface is at a temperature less than about 200° C. during forming the layer. In a more specific embodiment, the substrate surface is at a temperature of less than about 100° C. during forming the layer. In a specific embodiment, the silane precursor comprises at least one of disilane, trisilane, neopentasilane, and trisilylamine. In another embodiment of this aspect, the halogenated or cyanated silane precursor further comprises carbon. In a specific embodiment, the silane precursor comprising carbon is selected from the group consisting of 1,3,5-trisilapentane and 1,3,5-trisilacyclohexane, word to include any other precursors with bridging methylenes between silicon atoms. In one embodiment of this aspect, treating the substrate surface to reduce the amount of hydrogen on the substrate surface comprises exposing the substrate surface to a dehydrogenating plasma. In a further embodiment, wherein the dehydrogenating plasma is selected from the group consisting of Ar, He and $H_2$ plasma. Dehydrogenating and nitriding occur substantially simultaneously in one embodiment. In contrast, in another embodiment, dehydrogenating and nitriding occur sequentially.

There are special concerns regarding the first pass of deposition because the use of the halogenated carbosilanes and silanes relies on the reactivity of Si—X with a surface handle, such as an N—H group. When a substrate surface is provided, there may be no functional groups on the surface for the activated carbosilanes or silanes to react with. In this case, the substrate will need to be treated in such a way as to add functionality. Functionality may be obtained by way of adding N—H groups to the surface. O—H groups may also be added as an alternative, or in addition to N—H groups. The addition of these functional groups may be carried out by depositing a thin layer of another film with the requisite functional groups. In one embodiment, if non-conformality can be tolerated, then a layer of SiC may be deposited via another method. For example, about 5 to about 10 Angstroms may be deposited via chemical vapor deposition.

Another method of making a surface reactive to halides or cyano moieties is by exposing the substrate surface to a plasma. In one embodiment, about 10 Angstroms of another film is added. In another embodiment, about 5 Angstroms is added. One example of this method is by starting with a very low power nitrogen-containing plasma. While not wishing to be bound by a particular theory, excitation of a precursor containing the functional groups with a low power plasma (e.g., 20 W) is thought to create a mobile oligomers (possibly in a liquid phase) useful for driving surface saturation. While such a process may not be entirely self-limiting, deposition rates have been shown by experimental evidence to have an inverse dependence on temperature, which may indicate a large and partially reversible condensation component. Such a process can be useful for depositing an initiation layer and/or to simulate self-limiting adsorption steps, thereby permitting the systematic optimization of plasma step(s) to provide desired film properties and promote true ALD growth behavior.

In some cases, the conformality of films deposited using such low power plasma steps may be sufficiently conformal such that even after subsequent densification they may provide "ALD-like" conformality. A useful way to enhance such conformality is to employ a plasma activation step at the end of the activation sequence, such as one resulting in the formation of N—H bonds, which promotes the irreversible attachment of the first monolayer of precursor deposited in a low power plasma step, while subsequently deposited materials are bound reversibly, and may re-enter the gas phase and be purged away during a subsequent purge step. While the final surface activation step, applied immediately prior to the introduction of precursor but after plasma densification, may involve a nitrogen plasma, it may also involve a non plasma step such as simple exposure of the surface to a flow of ammonia ($NH_3$). Note that under such conditions it is possible to employ a reactive carbosilane precursor (such as 1,3,5-trisilapentane) "as is" (without modifications involving halogenation or cyanation) to form acceptably conformal films for many application. In one embodiment, the substrate can be exposed to a low power plasma a nitrogen-containing plasma. Generally, exposure of "seed" films containing Si, C, and H to N containing plasmas is effective for generating films exhibiting N—H functionality as detectable by growth of a characteristic absorption between about 3200-3600 $cm^{-1}$ in the FT IR. Typical conditions entail pressures in the range of 0.5 Torr to 20 Torr and RF power levels (13.56 MHz, direct plasma) of between 25 W and 500 W, for example 100 W for a duration of 2 sec at a total pressure of 4 Torr and partial pressure of nitrogen between about 1 Torr and 3 Torr, the balance being He or Ar. In cases where the film being treated contains very little H (for example if a plasma process has already been performed to remove H) a small amount of hydrogen may also be added to the plasma mixture to promote the generation of more N—H bonding.

Accordingly, one way of providing a substrate surface reactive to halogen and pseudohalogen moieties relates to a method of forming a layer on a substrate surface, the method comprising providing a substrate, exposing the substrate surface to a carbosilane precursor containing at least one carbon atom bridging at least two silicon atoms, exposing the carbosilane precursor to a low-powered energy source to provide a carbosilane at the substrate surface, densifying the carbosilane, and exposing the carbosilane surface to a nitrogen source. The process then may be repeated to add additional layers using non-activated precursors.

Thus embodiments of this deposition method are not true PEALD processes in the sense that they are not self-limiting with respect to the application of the current silicon precursor, although they achieve ALD-like results. The deposited films achieve a high level of conformality. Additionally, self-limiting deposition can be achieved with the introduction of activating substituents (essentially good leaving groups) that would result in their reaction with surface N—H functionality generated in the final Nitrogen plasma activation sequence. While not wishing to be bound to any particular theory, it is thought that exposure to a nitrogen source induces nitrogen insertion into the Si—H bonds to yield N—H functionality on the surface. These N—H groups may then react with a halogenated or cyanated precursor, as described above, in subsequent steps to achieve a self-limiting reaction. Accordingly, this aspect of the invention provides a substrate that has a substrate surface reactive to halides or cyano moieties.

In specific embodiments, carbosilane precursors containing at least one carbon atom bridging at least two silicon atoms are used to produce thin films of SiC. In some embodiments, these thin films of SiC can then be converted to SiCN by displacing some of the carbon atoms from the SiC. Carbosilane precursors, as described herein, are used to deposit a thin layer of a silicon-containing film. While not wishing to be bound by any particular theory, it is thought that the carbosilane is polymerized at the substrate surface after exposure to a low-powered energy source. The carbosilane precursor is exposed to a low-powered energy source, which forms a layer of the precursor on the substrate surface. In one embodiment, exposing the carbosilane precursor to a low-powered energy source comprises exposing the carbosilane precursor to an electron beam. In another embodiment, exposing the carbosilane precursor to a low-powered energy source comprises exposing the carbosilane precursor to a low-powered plasma. In a specific embodiment, the low-powered plasma has a value of about 10 W to about 200 W. In another embodiment, the precursor is exposed to the low-powered plasma for between about 0.10 seconds and about 5.0 seconds.

Carbosilane precursors have been demonstrated to undergo efficient densification/dehydrogenation to silicon-rich SiC. In one embodiment, densification/dehydrogenation is plasma-induced. A helium, argon and/or hydrogen-containing plasma may be used for dehydrogenation. In specific embodiments, dehydrogenation involves the use of plasma containing $H_2$.

In addition to densification/dehydrogenation, nitrogen may be introduced into the SiC layer by nitridation to form SiCN. This occurs by exposing the carbosilane surface to nitrogen source. In one embodiment, this comprises flowing ammonia. In an alternative embodiment, nitridation occurs via exposure to a nitriding plasma. In a more specific embodiment, this nitriding plasma comprises $N_2$. In yet another alternative embodiment, nitridation does not occur.

These deposition processes can be accomplished using relatively low RF power conditions and at temperatures lower than previously available. In previous methods, higher temperatures of more than 500° C. were necessary. In specific embodiments, substrate temperature during deposition can be lower than about 200° C. In some embodiments, substrate temperature may be below 100° C.

Carbosilanes for this non-halogenated precursor deposition method may be linear, branched or cyclic. A particularly suitable type of carbosilane is one that contains a bridging methylene groups between at least two silicon atoms, such that the carbon in the methylene group is bonded to the at least two silicon atoms. In a further embodiment, the methylene group bridges two silicon atoms. Either one, both, or neither of the two silicon atoms may be halogenated or pseudohalogenated. Higher carbosilanes with an extended Si—C—Si backbone are particularly suitable as they tend towards dehydrogenative densification reactions, instead of fragmentation. In another embodiment, the carbosilane contains a bridging $CH_2$ group or simple C atom between three or four silicon atoms respectively. Precursors without such bridging carbons, such as those initially containing only terminal methyl substituents may undergo rearrangements on plasma excitation to form methylene bridged carbosilanes and are thus also suitable, though in this case there may also be substantial cleavage of the Si—C bond of the Si—$CH_3$ substituent.

Polycarbosilanes containing more extended backbones of alternating Si—C—Si—C—Si bonds, such as 1,3,5-trisilapentane, are particularly preferable for this method. Examples of suitable carbosilane precursors include, but are not limited to 1,3,5-trisilapentane, 1,3,5-trisilacyclohexane, 1,3-disilabutane, 1,3-disilapropane and 1,3-disilacyclobutane. In a particular embodiment, the carbosilane precursor is 1,3-disilabutane. In another particular embodiment, the carbosilane precursor is 1,3,5-trisilapentane. Where a desired level of carbon is desired and the precursor contains only terminal methyl substituents, it is generally necessary to begin with precursors possessing at least twice the Si:C ratio desired in the final film.

Another aspect of the invention relates to a method of forming a layer on a substrate, the method comprising providing a substrate having silicon and hydrogen on the substrate surface; exposing the substrate surface to a nitrogen-containing plasma to enhance reactivity of the substrate surface to silicon-halide bonds or silicon-cyano bonds; reacting the surface of the substrate with a halogenated or cyanated precursor; and exposing the substrate surface to dehydrogenating plasma to reduce the amount of hydrogen on the substrate surface. In a specific embodiment of this aspect, the silicon halide or silicon cyano species further contains carbon. In one embodiment, the substrate surface is at a temperature less than about 200° C. during forming the layer. In a more specific embodiment, the substrate surface is at a temperature of less than about 100° C. during forming the layer.

In some embodiments, a plasma system and processing chamber or chambers which may be used during methods described here can be performed on either PRODUCER, CENTURA, or ENDURA systems, all available from Applied Materials, Inc., Santa Clara, Calif. A detailed description of suitable ALD processing chambers may be found in commonly assigned U.S. Pat. Nos. 6,878,206; 6,916,398, and 7,780,785.

The approaches of low temperature atomic layer deposition of SiCN and SiN films described above may also be used for the deposition of extremely thin, defect-free and conformal films for applications outside of the electronics industry. Such applications include for the preparation of barrier and passivation layers. Additionally, the low temperature reactivity would make the processes applicable to the coating of organic substrates, including plant- and animal-derived tissues and materials.

EXAMPLES

Example 1

Three SiCN films were deposited using 1,3,5-trisilapentane using the conditions listed in the Table 1. Films 1, 2, and 3 were formed using multistep PECVD deposition and treatment-type sequences, with very low powers (20 W) and short times (0.25 sec) used in the first step. This very low power and short exposure time formed 3-4 A of a "seed" layer per cycle. Upon completion of this first step, the flow of the 1,3,5-trisilapentane precursor was turned off. A flow of inert gases was continued until residual traces of the precursor were purged from the process chamber. Once purge was completed, gas flows were readjusted and stabilized at the values selected for the first plasma treatment step and again for a second plasma treatment step as indicated in Table 1. After completion of the full sequence, the entire cycle was then repeated until a desired film thickness was reached, for which the measurements reported here was at least 100 A and more generally 200 A thick.

Films 1, 2, and 3 differed in respect to the plasma densification and nitrogenation steps employed. Film 2 was deposited in the same manner as Film 1, but also featured exposure to a He/Ar plasma. Film 3 was deposited in the same manner as Film 2, but featured a nitrogen plasma at 100 W, instead of the 200 W used for Films 1 and 2. Table 1 also shows the elemental composition of all three films deposited at the various conditions determined using Rutherford backscattering. It should be noted that in this particular case analysis of the films for hydrogen content was not performed, though there was likely residual hydrogen remaining behind in the films. Most relevant for comparisons to data on films derived from the precursor HMDS described in Example 2 are C:Si and N:Si ratios which can be calculated independent of the H content. Because 1,3,5-trisilapentane contains no nitrogen, all of the nitrogen incorporated into films derived from 1,3,5-trisilapentane can be attributed to the presence of nitrogen gas added during the plasma treatments. The selection of specific treatment conditions provides some means for adjusting the final film composition.

TABLE 1

Elemental Content of Deposited Films
BULK Films

| Element | Film 1: Deposition: 0.25 sec/20 Watt dep Treatments: 1.5 sec $H_2$ plasma at 100 W, 2.10 sec $N_2$ Plasma at 200 W | Film 2 Deposition: 0.25 sec/20 Watt dep Treatments: 1.5 sec $H_2$ plasma at 100 W 2.5 sec He/Ar at 150 W 3.5 sec $N_2$ Plasma at 200 W | Film 3 Deposition: .25 sec/20 Watt dep, Treatments 1.5 sec $H_2$ plasma at 100 W 2.5 s He/Ar Plasma at 150 W 3.2 sec $N_2$ Plasma at 100 W |
|---|---|---|---|
| Si | 29 | 33 | 33 |
| C | 11 | 12 | 19 |
| N | 56 | 55 | 47 |
| O | 4 | 0 | 0 |
| Ar | 0.3 | 0.3 | 1 |
| Approximate (average) thickness of film removed by 5 min exposure to dilute HF and etch raters based on 5 min etch time | | | |
| | 30 Ang total | 20 Ang total | No significant etch |
| | 6 Ang/min | 4 Ang/min | <1 Ang/min |

Etch behavior was determined to be non-linear and, while not wishing to be bound to any particular theory, appears to involve the relatively rapid removal of a thin oxidized surface layer, after which subsequent extended exposure to the etchant has little effect. However, for consistency in comparing results to those of Example 2, rates are reported based on a 5 min etch time in 100:1 HF. Similar behavior was observed using 6:1 BOE (6 parts concentrated $NH_4F$/1 part concentrated HF).

Figure 1B:
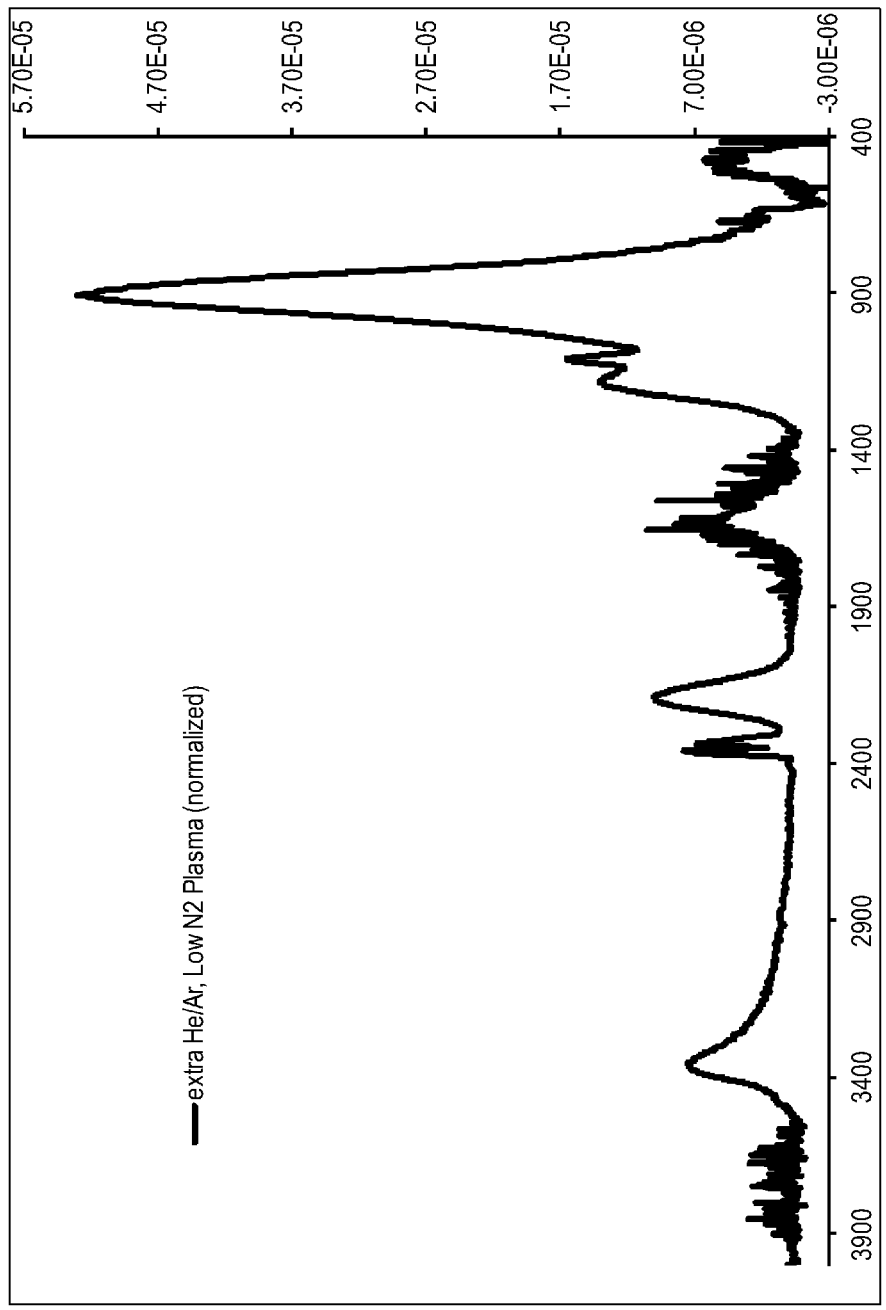
Figure 1C:
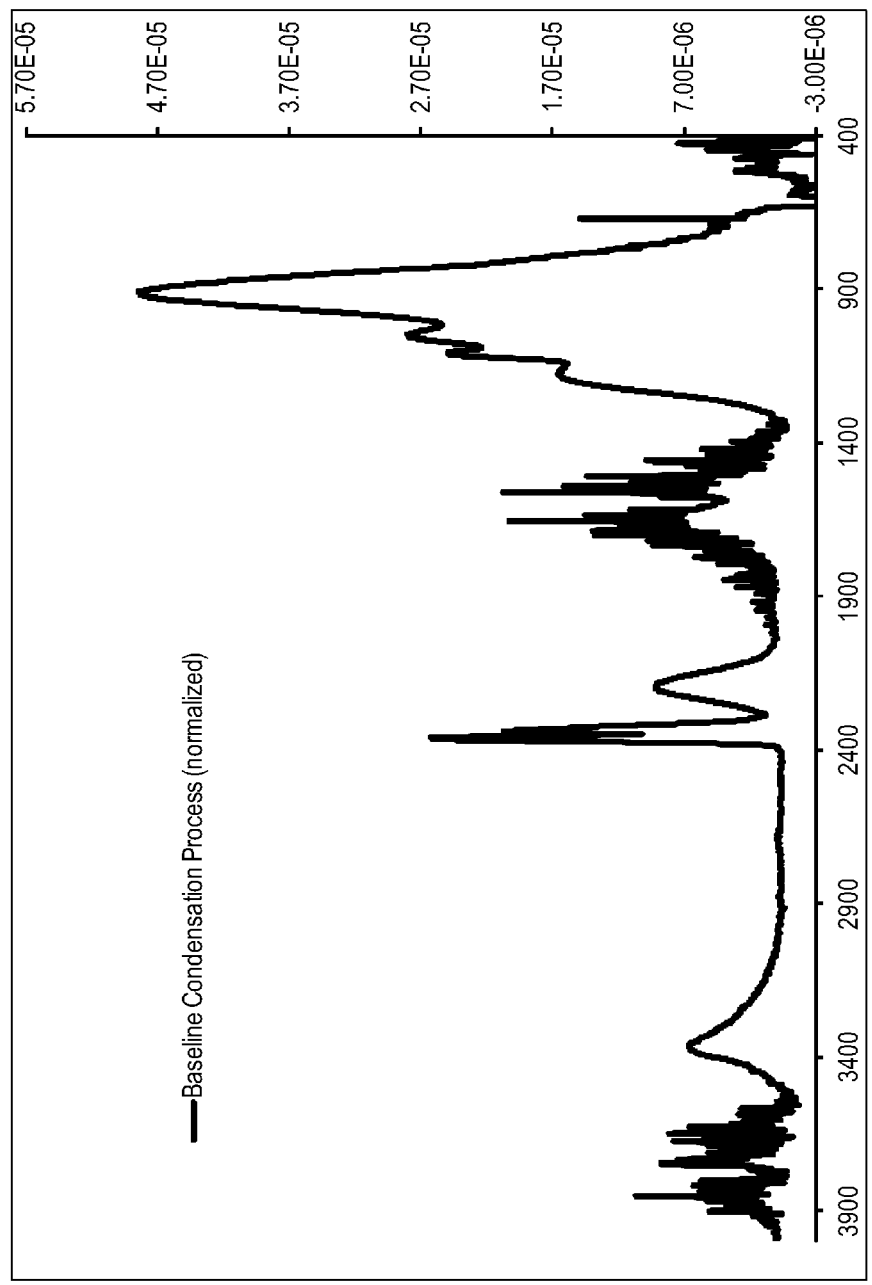

FIGS. 1A-C are graphical representations of Fourier transform infrared (FTIR) spectra of the SiCN films of Example 1. Film 1, which is a typical baseline process condensation, is represented in FIG. 1C. Film 2 is represented in FIG. 1B. Film 3 is represented in FIG. 1A. Each of the three datasets was normalized. The peak at about 3300 $cm^{-1}$ corresponds to N—H bonding. The peak at about 2300 cm corresponds to $CO_2$ present in ambient air. The broad peak centered at around 900 $cm^{-1}$ corresponds to SiCN and the shift seen from Film 1. The shift seen from films 1 to Film 3 is attributable to increasing carbon content, which also corresponds to their increasing resistance to wet HF etch chemistries.

Example 2

Additional SiCN films 4 through 6 were deposited using the precursor hexamethyldisilazane (HMDS) which has the formula $[(CH_3)_3Si]_2NH]$. Accordingly, this HMDS does not contain a carbon atom bridging at least two silicon atoms. HMDS has a 3:1 carbon to silicon ratio, with each silicon atom bound to three methyl substituents and one nitrogen. A series of cyclic depositions analogous used in depositing Films 1 through 3 were employed for the deposition of Films 4, 5, and 6, with results listed in Table 2 below. In each case, a "seed" layer was deposited at 20 W RF, 6 Torr, delivering HMDS from a pressure controlled vapor draw ampoule using Ar carrier gas analogous to conditions employed for 1,3,5-trisilapentane in Example 1. The deposition rate was determined to be approximately linear with total plasma on time/cycle and the initial step followed by a long inert gas purge to remove residual precursor from the chamber. Film 4 was deposited using only a hydrogen plasma treatment cycle. Film 5 was deposited with an $H_2$ plasma followed by a $N_2$ plasma. Film 6 was deposited using plasma comprising a mixture of $H_2$ and $N_2$.

Table 2 also shows the elemental content of Films 4 through 6, as determined by Rutherford backscattering, as well as 100:1 wet HF etch rates. It should be noted that unlike in Films 1 through 3, Rutherford backscattering analysis for Films 4 through 6 included a determination of hydrogen content in the films. Accordingly, direct comparisons between Films 1 through 3 and Films 4 through 6 are limited to ratios of carbon to silicon or nitrogen to silicon.

TABLE 2

Elemental Content of Deposited Films Treatment

| Element | Film 4 10 sec $H_2$ Plasma at 300 W | Film 5 1.10 sec $H_2$ Plasma at 300 W 2.2 sec $N_2$ Plasma at 100 W | Film 6 7 sec $H_2$ + $N_2$ Plasma at 200 W |
|---|---|---|---|
| Si | 25.50% | 26.50% | 32.50% |
| C | 34% | 19% | 0% |
| N | 18.50% | 38.50% | 47.50% |
| O | 0% | 3% | 9% |

TABLE 2-continued

Elemental Content of Deposited Films Treatment

| Element | Film 4 10 sec $H_2$ Plasma at 300 W | Film 5 1.10 sec $H_2$ Plasma at 300 W 2.2 sec $N_2$ Plasma at 100 W | Film 6 7 sec $H_2$ + $N_2$ Plasma at 200 W |
|---|---|---|---|
| H | 22% | 13% | 11% |
| 100:1 DHF Etch Rate | <1 Ang/min | >20 Ang./min (complete loss) or >100 A thick film in 5 min. | >20 Ang./min. (complete loss) of >100 A thick film in 5 min. |

Figure 2:
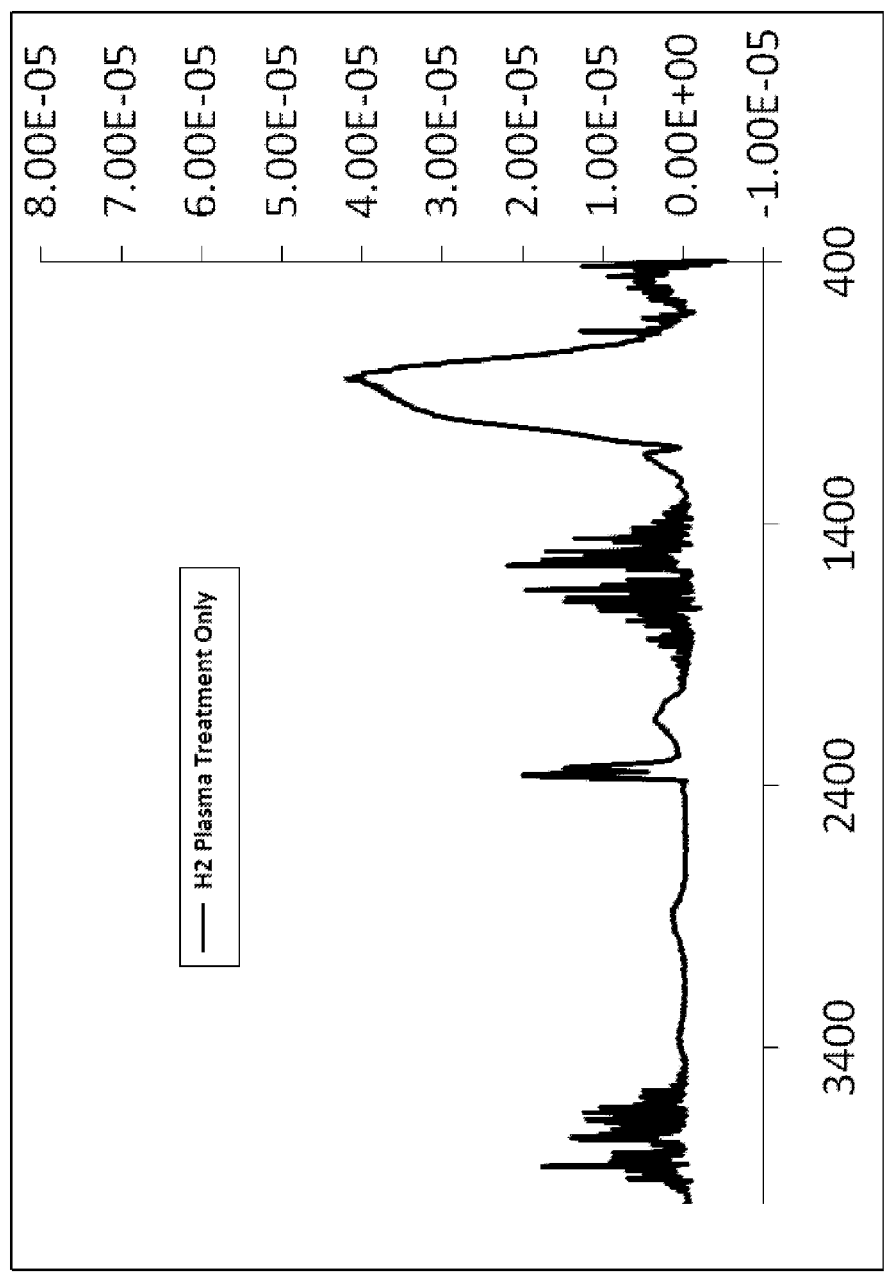
FIG. 2 is a Fourier transform infrared spectra of a SiCN film formed in accordance with an embodiment of the invention.
Figure 3:
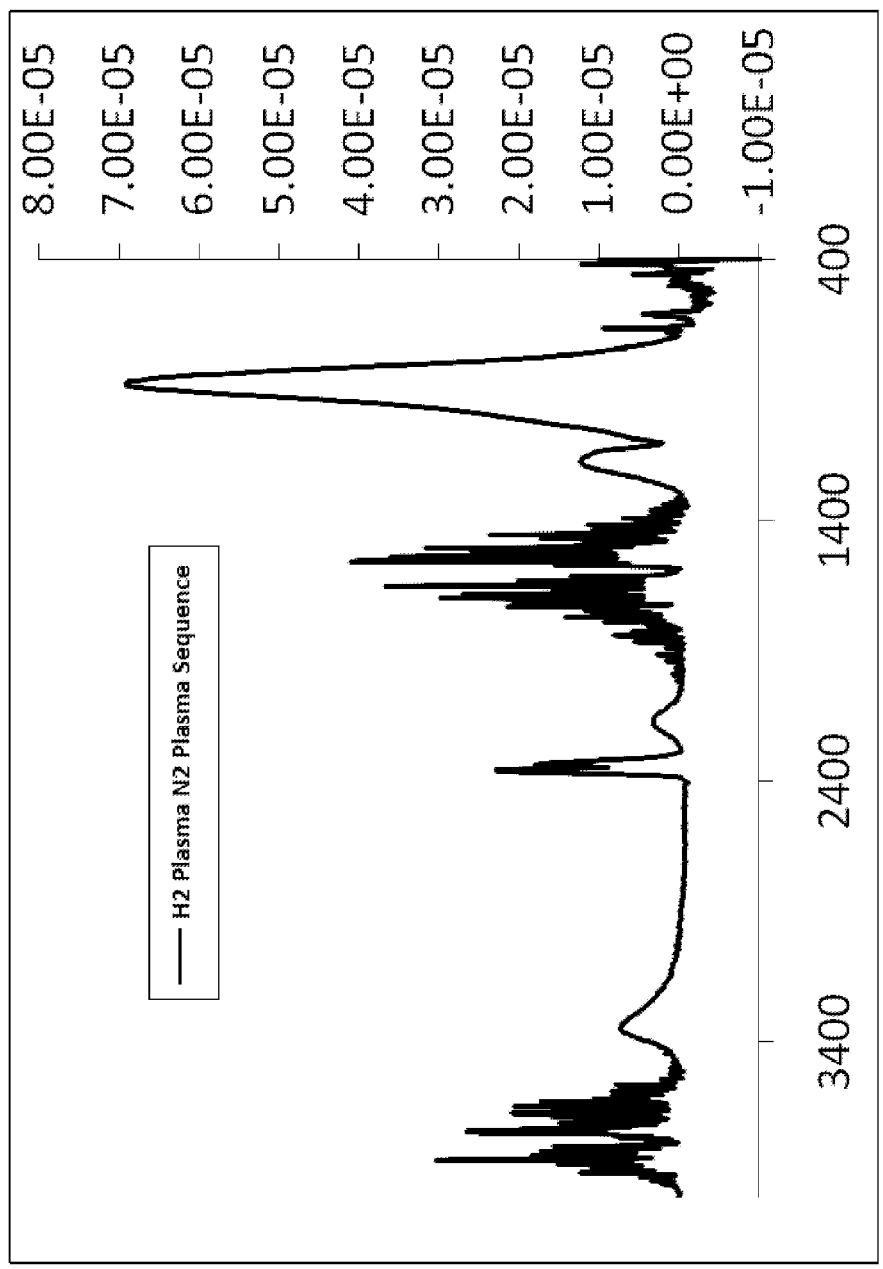
FIG. 3 is a Fourier transform infrared spectra of a SiCN film formed in accordance with an embodiment of the invention.
Figure 4:
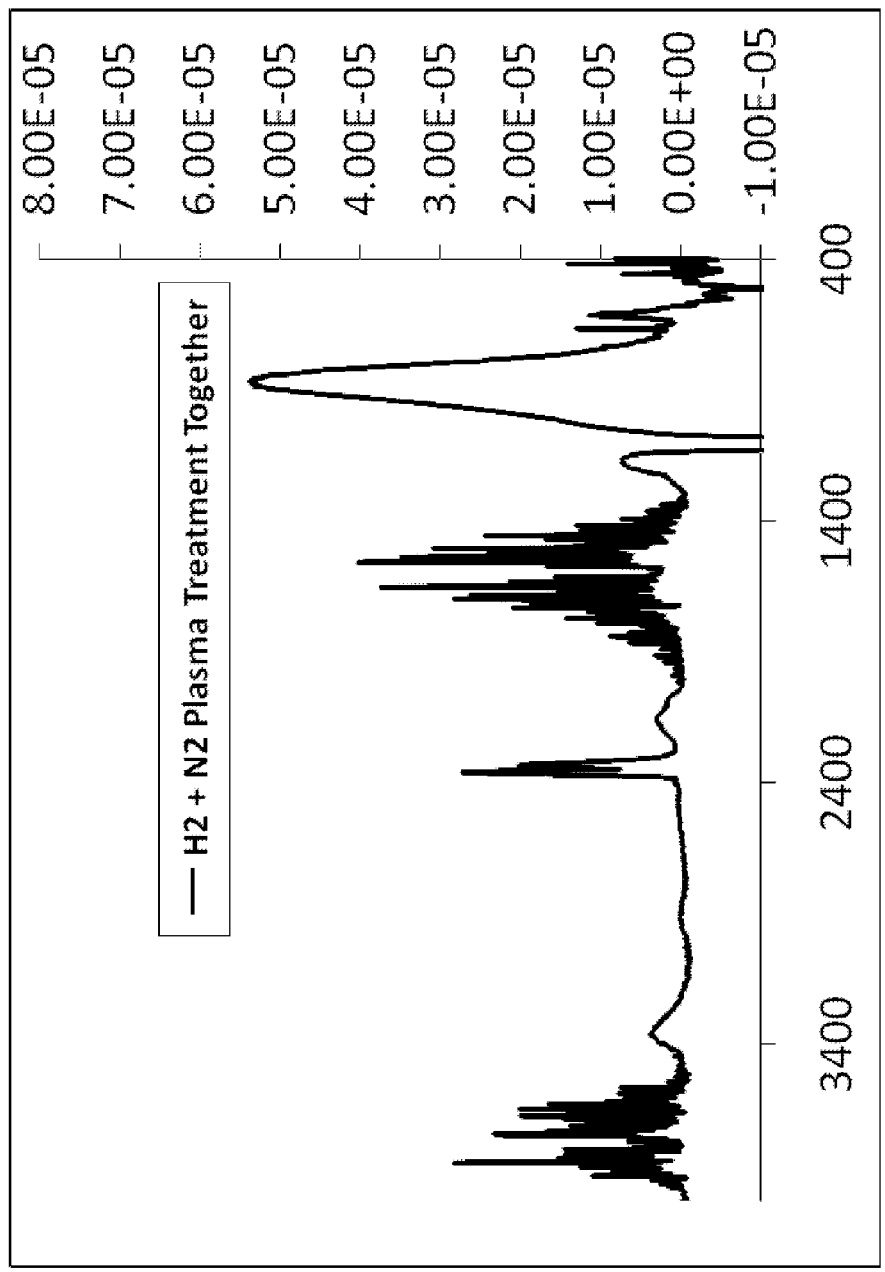
FIG. 4 is a Fourier transform infrared spectra of a SiCN film formed in accordance with an embodiment of the invention.

FIGS. 2-4 are graphical representations of Fourier transform infrared (FTIR) spectra of the Films 4 through 6, respectively. The results in FIG. 2 represent deposition followed by the use of an using an $H_2$ plasma only. The results in FIG. 3 represent deposition using an $H_2$ plasma followed by an $N_2$ plasma (in sequence) treatment analogous to that applied in Examples 1. The results in FIG. 4 represent deposition using a plasma comprising a mixture of $H_2$ and $N_2$, and result in complete removal of carbon from the film.

In contrast to the work with 1,3,5-trisilapentane, the conditions necessary to reduce C—H absorptions in the IR spectra and induce growth in the SiCN region at about 800-1000 $cm^{-1}$, were found to result in substantial removal of carbon. In fact, without any additional treatment the C:Si ratio, as determined by RBS, dropped from the initial value of 3:1 to only 1.3:1 While Film 4 was removed slowly in 100:1 HF, the application of additional steps involving a short $N_2$ plasma step (as seen in Film 5 and analogous to those employed in Example 1 films), or an alternative process which combined $H_2$ and $N_2$ plasmas into a single step (as seen in Film 6), underwent significantly higher carbon loss, and exhibited low resistance to etching by 100:1 HF.

Interestingly, the $N_2$ plasma step added to each cycle of the process used for Film 4 process to give Film 5 resulted in the C:Si ratio decreasing from 1.3:1 to 0.72:1, with the result still being higher than the ratios between 0.38:1 and 0.58:1 measured for the 1,3,5-trisilapentane-derived Films 1-3. Yet it was the 1,3,5-trisilapentane-derived films which exhibited superior etch resistance.

While not wishing to be bound by any particular theory, these results suggest the bridging carbon atoms present in precursors (and low power seed films derived therefrom) are more effectively retained and converted to etch resistant carbides than carbon originally present in the form of terminal methyl groups. Furthermore, it should be noted that higher RF power levels and longer $H_2$ and/or inert gas plasma treatment times were necessary to promote condensation of HMDS derived seeds to a level approximating the properties of a 1,3,5-trisilapentane-derived films. All the films of Example 1 were prepared using a final nitrogen plasma step (required for their conversion to SiCN) after which they were shown to still exhibit reasonably high (and useful) resistance to wet HF etch processes. However, applying a similar process in the preparation of Film 5 (derived from the precursor HMDS) resulted in its loss of HF etch resistance—even though the final C:Si ratio remained higher (0.75) than measured in any of the 1,3,5-trisilapentane derived films. It may be concluded that carbon originally present as "bridging" methylenes between Si atoms converts to a form exerting a much greater impact on etch behavior than can be estimated using compositional analysis alone. In the case of the 1,3,5 trisilapenetane, the addition of a nitrogen plasma step can effectively incorporate nitrogen without exerting a large effect on the C:Si ratio (dropping from the value of 0.67:1 calculated from the ratio in the precursor to 0.53:1 in the case of Film 3). Adding an analogous nitrogen plasma step at the end of the densification process used for the HMDS Film 4 resulted in a much more significant impact on carbon content (1.3 dropping to 0.72 together with a severe degradation of etch resistance) suggesting the bonding of the retained carbon in each case is significantly different.

While it may indeed be possible to achieve a process with more classic, self-limiting reactivity by incorporating an active leaving group onto the HMDS molecule (by replacing one of the methyl substituents with a halide or cyanide, the stability of such a precursor may be severely compromised by the potentially reactive, albeit somewhat hindered, N—H bond already present. For this reason precursors possessing both bridging carbon and reactive Si—H bonds (such as 1,3, 5-trisilapentane) are particularly well suited as SiCN precursors, since carbon is efficiently retained while still permitting the introduction of Nitrogen (for example by inserting into Si—H bonds or Si—Si bonds). This results in the creation of reactive functionality not initially present in the precursor itself, thereby enabling use of schemes employing the various "activated" derivatives described herein, most or all of which would not be expected to be viable with an N—H functionality already present in the molecule, as would be the case with a material derived from HMDS.

Therefore, the films of Example 2 show that compositions exhibiting desirable etch properties required much longer and more aggressive H$_2$/inert plasma based densifications steps, after which films were still insufficiently stable to permit use of a nitrogen plasma activation step without significant loss of carbon and etch resistance. This demonstrates the superiority of Example 1 films, deposited according to various embodiments of the invention.

Thus, there is an apparent advantage of precursors such as 1,3,5-trisilapentane (which incorporate carbon in bridging positions between Si atoms) relative to more common precursors possessing non-bridging carbon substituents such as methyl (—CH$_3$), which is particularly evident when targeting applications requiring that the films to exhibit high wet etch resistance to chemistries such as HF (100:1 H$_2$O/concentrated HF), or mixtures such as buffered oxide etch (a mixture on 6:1 concentrated NH4F to concentrated HF) designed to rapidly etch SiO$_2$.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to specific embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a layer on a substrate surface, the method comprising:
   providing a substrate surface reactive to halides or cyano moieties;
   exposing the substrate surface reactive to halides or cyano moieties to a halogenated or cyanated carbosilane precursor including carbon, silicon and hydrogen to form a layer containing carbon, silicon and hydrogen;
   at least partially dehydrogenating the layer containing carbon, silicon and hydrogen; and
   nitriding the layer containing carbon, silicon and hydrogen.

2. The method of claim 1, wherein nitriding the layer comprises exposing the layer containing carbon, silicon and hydrogen to a nitrogen-containing plasma.

3. The method of claim 1, wherein the substrate surface is at a temperature less than about 200° C. during forming the layer.

4. The method of claim 1, wherein the carbosilane precursor is monohalogenated.

5. The method of claim 1, wherein the carbosilane precursor has a structure represented by:

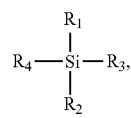

wherein R$_1$ is selected from one or more of a halogen or pseudohalogen, R$_2$ is a methyl group, and R$_3$ and R$_4$ are each independently a halogen or pseudohalogen, methyl or hydrogen.

6. The method of claim 1, wherein the carbosilane precursor contains a bridging methylene group, wherein the carbon in the methylene group is bonded to two silicon atoms.

7. The method of claim 1, wherein the carbosilane precursor is selected from the group consisting of 1,3-disilapropane, 1,3,5-trisilapentane, 1,3-disilabutane, 1,3-disilacyclobutane and 1,3,5-trisilacyclohexane.

8. The method of claim 1, wherein dehydrogenating the layer containing carbon, silicon and hydrogen comprises exposing the layer containing carbon, silicon and hydrogen to a plasma containing at least one of hydrogen, helium and argon.

9. The method of claim 1, wherein dehydrogenation and nitridation occur substantially simultaneously or sequentially.

10. The method of claim 1, wherein the carbosilane precursor is symmetrical prior to halogenation or cyanation.

11. A method of forming a layer on a substrate surface, the method comprising:
    providing a substrate surface reactive to halides or cyano moieties;
    exposing the substrate surface reactive to halides or cyano moieties to a halogenated or cyanated silane precursor including silicon and hydrogen to form a layer containing silicon and hydrogen;

at least partially dehydrogenating the layer containing silicon and hydrogen; and nitriding the layer including silicon and hydrogen, wherein nitriding the layer comprises exposing the layer containing silicon and hydrogen to a nitrogen-containing plasma.

12. The method of claim 11, wherein the substrate surface is at a temperature less than about 200° C. during forming the layer.

13. The method of claim 11, wherein the silane precursor is monohalogenated.

14. The method of claim 11, wherein the silane precursor comprises at least one of disilane, trisilane, neopentasilane, and trisilylamine.

15. The method of claim 11, wherein the halogenated or cyanated silane precursor further comprises carbon to provide a carbosilane precursor.

16. The method of claim 15, wherein the carbosilane precursor contains a bridging methylene group, wherein the carbon in the methylene group is bonded to two silicon atoms.

17. The method of claim 11, wherein treating the substrate surface to reduce the amount of hydrogen on the substrate surface comprises exposing the substrate surface to a dehydrogenating plasma.

18. The method of claim 11, wherein the dehydrogenating plasma is selected from the group consisting of Ar, He and $H_2$ plasma.

19. The method of claim 11, wherein dehydrogenating and nitriding occur substantially simultaneously or sequentially.

20. A method of forming a layer on a substrate, the method comprising:

providing a substrate having silicon and hydrogen on the substrate surface;

exposing the substrate surface to a nitrogen-containing plasma to enhance reactivity of the substrate surface to silicon-halide bonds or silicon-cyano bonds;

reacting the surface of the substrate with a halogenated or cyanated silane or carbosilane precursor; and exposing the substrate surface to dehydrogenating plasma to reduce the amount of hydrogen on the substrate surface.

* * * * *